United States Patent [19]
Katz et al.

[11] Patent Number: 5,623,642
[45] Date of Patent: Apr. 22, 1997

[54] METHOD FOR SIMULATING NEWTONIAN INTERACTIONS OVER A COMPUTER NETWORK

[75] Inventors: Warren J. Katz, Cambridge; Darrin Taylor, Malden; John Morrison, Bedford, all of Mass.

[73] Assignee: Mäk Technologies, Inc., Cambridge, Mass.

[21] Appl. No.: 223,604

[22] Filed: Apr. 6, 1994

[51] Int. Cl.$^6$ .................................. G06F 3/00; G06G 7/48
[52] U.S. Cl. .................... 395/500; 364/578; 364/461; 364/424.027; 364/474.2; 395/90; 463/2; 463/7; 273/442; 273/454; 434/65; 434/69
[58] Field of Search ........................... 364/461, 578, 364/424.02, 474.2, 423, 806, 514 A, 514 R, 410; 395/90, 500, 119–122, 130, 135, 152, 129, 154–159, 800, 650; 434/65, 69, 307, 373, 247; 318/568.22, 568.17; 73/866.4, 7; 901/9, 15, 23, 26; 273/442, 454, 148 B; 74/471 XY, 490.06; 463/2, 7, 30, 36

[56] References Cited

U.S. PATENT DOCUMENTS

| | | | |
|---|---|---|---|
| 4,888,707 | 12/1989 | Shimada | 395/90 |
| 4,914,958 | 4/1990 | Van Damme | 73/866.4 |
| 5,184,319 | 2/1993 | Kramer | 364/578 |
| 5,263,382 | 11/1993 | Brooks et al. | 74/471 XY |
| 5,336,982 | 8/1994 | Backes | 318/568.22 |
| 5,368,484 | 11/1994 | Copperman et al. | 364/578 |
| 5,378,155 | 1/1995 | Eldridge | 364/578 |

OTHER PUBLICATIONS

Mäk Technologies, Inc. "Distributed Interactive Simulation Protocol Extensions for logistics Simulation" Proposal No date.
Morrison et al. "Distributed Interactive Simulation Protocol Extensions for logistics Simulations" Feb. 21, 1992.
Katz et al. "Detailed Analysis and Proposed Implementation of Collision Interactions in Distributed Simulation", May 11, 1993.
Darrin Taylor, "Collisions and Fields DIS Networks" Aug. 24, 1993.
Taylor et al. "Aspects of the Newtonian Protocol and its application to Distributed Simulation" Mar. 1, 1994.
Weise, "Multilevel Verification of Mos Circuits" Apr. 1990.
Mäk Technologies Semi–annual Status Report, Oct. 1, 1993.
Morrison et al. "Distributed Interactive Simulation Protocol Extensions for Enhanced Fidelity" Proposal II May 28, 1992.

*Primary Examiner*—Kevin J. Teska
*Assistant Examiner*—Jacques Louis-Jacques
*Attorney, Agent, or Firm*—McDermott, Will & Emery

[57] ABSTRACT

This invention enables a bandwidth efficient computer simulation of sustained contact between objects. When an object comes into sustained contact with a second object, it will communicate to the second object a transfer function describing the contact, and vice-versa. The transfer function enables the objects to simulate the sustained contact for as long as the contact continues, eliminating any need for further network communication between the objects regarding the state of the contact until the contact terminates.

16 Claims, 6 Drawing Sheets

FIG. 7

| BYTES | TRANSFER FUNCTION RECORD | VALUE |
|---|---|---|
| 1 | NUMBER OF f TERMS TO FOLLOW | 1 |
| 1 | NUMBER OF p TERMS TO FOLLOW | 2 |
| 4 | NUMERICAL CONSTANT $f_{11}$ | 1 |
| 1 | NUMERICAL CONSTANT $a_{11}$ | 0 |
| 1 | SUMMATION INDEX $i_f$ | 1 |
| 1 | PRODUCT INDEX $j_f$ | 1 |
| 4 | NUMERICAL CONSTANT $p_{11}$ | $\frac{1}{2}\rho C_d A$ |
| 1 | NUMERICAL CONSTANT $b_{11}$ | 1 |
| 1 | SUMMATION INDEX $i_p$ | 1 |
| 1 | PRODUCT INDEX $j_p$ | 1 |
| 4 | NUMERICAL CONSTANT $p_{12}$ | 1 |
| 1 | NUMERICAL CONSTANT $b_{12}$ | 1 |
| 1 | SUMMATION INDEX $i_p$ | 1 |
| 1 | PRODUCT INDEX $j_p$ | 2 |

METHOD FOR SIMULATING NEWTONIAN INTERACTIONS OVER A COMPUTER NETWORK

The U.S. Government has a paid-up license in this invention and the right in limited circumstances to require the patent owner to license others on reasonable terms as provided for by the terms of contract no. DAAH01-91-C-R269 awarded by the Small Business Innovation Research agency (SBIR). This contract in no way limits the rights of non-government entities to request and receive licenses under the invention.

BACKGROUND OF THE INVENTION

The present invention is directed to a method for implementing a computer simulation of sustained contact between distinct objects, such that realistic effects of the physical forces exerted on each object by the other during such contact are observed, and such that the use of network bandwidth or communications resources between the objects is greatly reduced.

Computer software has long been able to simulate and display contact between objects. The three primary contexts in which such software is used are video games, defense-related simulations, and industrial engineering simulations.

Computer software designed to simulate Newtonian interactions between objects, e.g., exchange of momentum, frictional force exchange, contact force exchange, elastic and inelastic collisions, etc., has been in existence for decades. The applications of such software have ranged from such low fidelity purposes as simple bouncing interactions between objects in a video game, to high fidelity interactions such as a military engineering simulation of the effect of a missile during its impact with a target. The low fidelity interactions of video games aren't necessarily modeled with accurate Newtonian physics models. The purpose of a video game is to entertain the user, and not to accurately represent physical reality. The military engineering simulation, however, is specifically designed to be as close to reality as possible. It therefore uses the most accurate physics models available. There are a range of applications in between these two extremes, where physical reality is traded off against other factors such as computational resource requirements (i.e., computer power).

Another tradeoff in simulation software design is time. Simulations are commonly designed to divide time into small slices, commonly called "frames." During a frame, the state of the simulation is held frozen in time such that the behaviors of objects from the previous frame can be individually propagated into the current frame. Frame lengths can vary from extremely short time values to extremely long ones. The missile example described in the previous paragraph may take only one one-thousandth of a second (one millisecond) to complete its entire interaction. A simulation designed to accurately predict the behaviors of the missile and the target may need to simulate thousands of intermediate points in time between the start and end of the interaction. This would lead to a frame time on the order of one one-millionth of a second (one microsecond). A modern day computer performing the simulation could not possibly complete the computational tasks required for a frame within only one microsecond. It may take several seconds of real time to simulate one microsecond of simulated time. This type of simulation is termed "slower than real-time." Further along this time spectrum, a video game, or a flight simulator, would have a frame time equal to real-time. This is because the simulation is interacting with a human, who would be distracted from his training task, or his entertainment, if the simulation ran slower or faster than the real world. This type of simulation is called "real-time." On the other end of the spectrum, a geologist may observe a simulation of the motion of continental plates. One simulation frame may represent one million years, but be simulated by the computer in less than one second. This type of simulation is termed "faster than real-time."

When several objects are simulated within the same computer program, simulating Newtonian interactions between them is a fairly simple task. During a frame, all objects are frozen in time, their dynamic and kinematic states are known and under control, and their new states after collisions and force exchanges can be computed for the next frame. This technique has been the most common method for computing Newtonian interactions between simulation objects. When objects are not simulated in the same computer program, or are simulated on different computers, the task of simulating Newtonian interactions is much more difficult, because there is less timing coordination and control over the dynamics and kinematics of the objects.

The Department of Defense has developed a real-time simulation technology called "Distributed Interactive Simulation" or DIS. DIS is a simulation technology which utilizes a standard networking protocol (known as the DIS Protocol) to allow autonomous simulation node computer systems to communicate the state of locally simulated objects to other nodes on the network. These independent nodes can each simulate a number of objects, otherwise known as DIS "entities." The DIS Protocol provides a very loose coupling between these entities. There are several advantages to this type of architecture which makes it ideal for simulating very large numbers of entities in the same virtual environment. The invention described herein can be used with the DIS Protocol or any similarly architected network protocol. There is an abundance of literature on DIS available from the federal government. The following paragraphs give a brief description of its advantages.

The DIS Protocol currently consists of some 27 different network packets which are passed between simulation nodes. The application specific information is encapsulated in TCP/IP/UDP Ethernet frames, but any low-level networking layers can also be used. The packets may be sent over any network media, from modems working over voice grade phone lines, to Asynchronous Transfer Mode (ATM) switches. More network bandwidth allows more entities to be supported. The packets describe things such as state information of dynamic entities, combat events (firing, detonation), resupply interactions, electromagnetic emissions (light, radar, energy weapons), etc.

One of the unique novelties of DIS is the predictive algorithms which allow entities on the network to greatly reduce the frequency of rebroadcasts of state. Each entity broadcasts its type, location, velocity, acceleration, orientation, and angular velocity in the form of a DIS Entity State Packet. All the receiving simulators can then propagate the sending entity into the future, relieving the sending entity of the responsibility to continually rebroadcast. When the error between the exact position of the entity and the predicted position exceeds a certain threshold, the sending entity will update the network with its new kinematic state. The DIS Entity State Packet, which contains this kinematic information and makes up most of the network traffic in the DIS protocol, is about 140 bytes long, and is broadcast anywhere from once every 5 seconds, to four to five times per second.

This architecture provides very flexible tradeoffs between computational loading, positional error, and network bandwidth. If highly accurate position information is required, such as in some military experiments, the error threshold may be reduced, which will result in more network broadcasts of state. Conversely, if the only network bandwidth available is a 9600 baud modem, and 25 entities are required on the system, the error thresholds can be increased, and more compute-intensive prediction algorithms can be used on the receiving ends. State-of-the-art DIS systems currently in use by the federal government are running up to 8000 entities on Ethernets, long haul networked from several locations.

The DIS protocol is self-healing. When a new entity enters the DIS world, it begins to broadcast Entity State packets. If recipients have never heard from this entity before, they simply add it to their remote entity database. If an entity is not heard from within five seconds, recipients will time it out, removing it from their remote entity database. Players can enter and leave at will without disturbing other participants (other than their appearance and disappearance), and dropped packets don't cause system failure. In this architecture there is no central server, thus no single point of failure.

As described above, DIS uses prediction algorithms to help reduce continual rebroadcast of state messages from simulation entities. The advantage of this approach is that many more entities can interact in the same virtual environment, but the penalty of this approach is that the perceived dynamic and kinematic state of remote entities is always an estimation which contains some positional error and time delay (due to network latency). This makes the simulation of sustained contact between DIS entities very difficult. DIS currently has no mechanisms for implementing sustained contact, though the capability is highly desired. This invention provides the capability to simulate these sustained contacts between remote entities on a network, while keeping network bandwidth usage to a minimum.

There are several needs for this capability in the DIS simulation domain. These include: logistics interactions (resupply), combat engineering functions (towing, bridge building, obstacle construction), aircraft carrier landings and launchings, etc. In the non-military domain, networked simulations for surgical training, entertainment, etc. will require tactile and force-feedback interactions between human participants in addition to all other kinds of contact. Protocols similar in nature to DIS will likely be used for these non-military systems. A DIS-type architecture is very suitable to distributed arcade systems, video games, virtual reality systems, etc. Next generation home-based virtual reality systems which will be networked to other such systems will undoubtedly use a networking approach similar to DIS. SIMNET and NPSNET are two additional examples of DIS-like protocols known in the prior art. It is therefore apparent that the present invention, which addresses the need for implementing simulated sustained contact, has valuable applications in both commercial and defense systems.

SUMMARY OF THE INVENTION

Accordingly, the present invention enables computer simulation of the effects of sustained contact between two objects while maintaining low inter-object communication requirements. When a sustained contact is detected, the contact is evaluated by each object and a force equation is determined that approximates the effect the objects will have on each other.

In accordance with this invention, this force equation is referred to as the "transfer function," which describes the effect of the sustained force exerted by each object over time. As explained in greater detail below, use of this transfer function provides the important advantage of enabling each object to simulate the changing effects of the force exerted by the other object without having to further communicate with the other object over the network, other than the equivalent DIS Entity State Packet information which must always be present, thereby avoiding additional network load.

Thus, the present invention provides a method for simulating sustained contact of first and second computer implemented objects on each other, comprising the steps of providing a computer system having the first and second computer implemented objects, implementing a transfer function describing the sustained contact of the first and second computer implemented objects on each other, and applying the transfer function to the first and second computer implemented objects, thereby enabling the first and second computer implemented objects to simulate the sustained contact each will have on the other.

Another embodiment of the present invention provides a computer system for simulating sustained contact of a first computer implemented object on a second computer implemented object, wherein a transfer function describes the sustained contact of the first computer implemented object on the second computer implemented object, and whereby the transfer function enables the second computer implemented object to simulate the sustained contact of the first computer implemented object.

Still another embodiment of the present invention is a computer program for simulating sustained contact of a first computer implemented object on a second computer implemented object, the computer program comprising instructions for implementing a transfer function to describe the sustained contact a first computer implemented object will have on a second computer implemented object, and instructions for applying the transfer function to the second computer implemented object, thereby enabling the second computer implemented object to simulate the sustained contact with the first computer implemented object.

Yet another embodiment of the present invention is a method for first and second computer implemented objects to simulate sustained contact with each other, comprising the steps of providing a computer system comprising at least one computer and at least one computer model, wherein the first and said second computer implemented objects exist in the computer system, detecting contact between the first and second computer implemented objects, determining whether the contact is a sustained contact, communicating a transfer function between the first and second computer implemented objects, evaluating the transfer function so as to describe the sustained contact of the first and second computer implemented objects on each other, and applying the transfer function to the first and second computer implemented objects, thereby enabling the first and second computer implemented objects to simulate the sustained contact with each other, until the first and second computer implemented objects detect termination of the contact.

A further embodiment of the present invention is a method for a first computer implemented object to simulate sustained contact with a second computer implemented object, comprising the steps of detecting contact between the first and second computer implemented objects, determining whether the contact is a sustained contact, communicating a transfer function between the first and second computer implemented objects, evaluating the transfer function so as to describe the sustained contact of the second computer implemented object on the first, and applying the transfer function to the first computer implemented object, thereby enabling the first computer implemented object to simulate sustained contact with the second computer implemented object, until detecting termination of the contact.

The invention itself, together with further objects and attendant advantages, will best be understood by reference to the following detailed description taken in conjunction with the accompanying drawings.

BRIEF DESCRIPTION OF THE DRAWINGS

FIG. 7 illustrates use of the data structure for representing a force resulting from a Newtonian interaction which may be simulated by the present invention.

DETAILED DESCRIPTION OF THE PREFERRED EMBODIMENT

The present invention will now be described and contrasted with the prior art. Computer generated objects, on their respective networked simulators, are currently limited to using collision packets to communicate their physical interactions over a DIS-like network. These collision packets contain sufficient information for the simulator of each object to implement their respective dynamic responses to the collision. A collision can be defined as a contact which begins and ends in the same frame. Attempts to implement a sustained contact using collision packets yields poor results. Simulating sustained contacts with collision packets amounts to representing the force relationship between two objects for the duration of the sustained contact as a sequence of collisions. A true sustained contact cannot be simulated by a sequence of collisions because the velocities of the bodies are equal while in contact. As a result, momentum cannot be transferred from one object to the other.

Figure 1A:
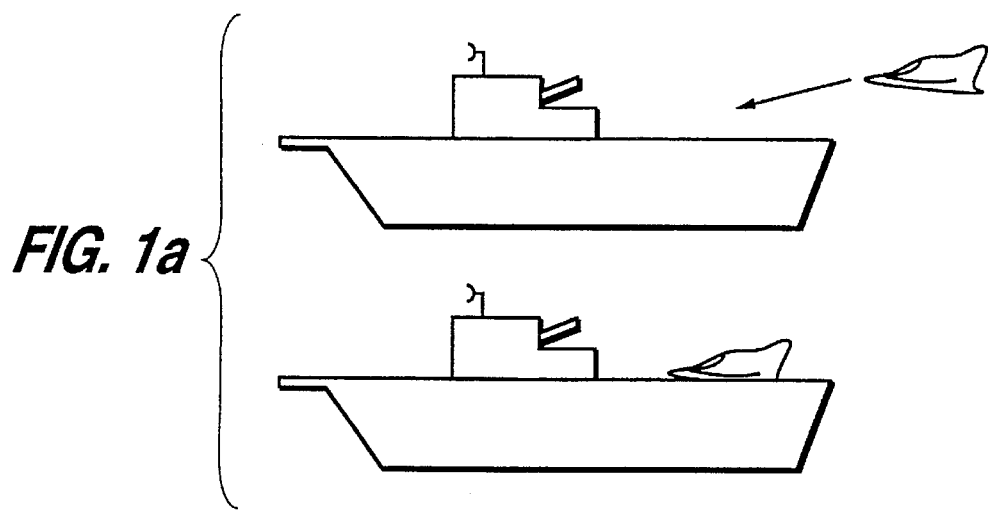
FIG. 1a illustrates sustained contact between two entities, an example of the type of contact simulated by the present invention.
Figure 1B:
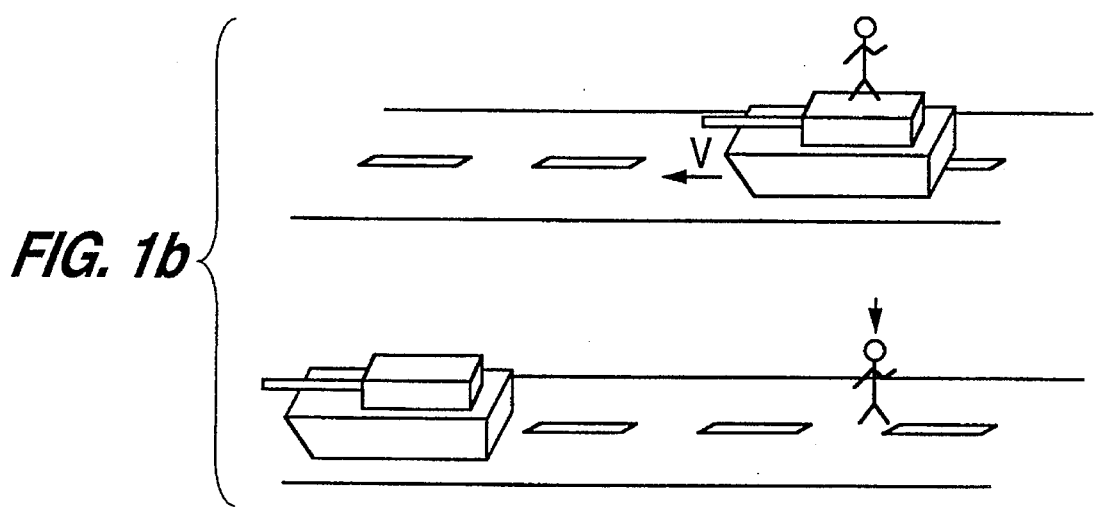
FIG. 1b is a second illustration of sustained contact between two entities that can be simulated by the present invention.

Turning now to the drawings, FIGS. 1a and 1b illustrate the type of contact that the present invention can simulate. As mentioned, prior art DIS-like simulation systems can detect the occurrence of contact between two computer implemented objects (hereinafter "objects"), but are not capable of realistically simulating the effects of sustained contact between the objects. For example, prior DIS-like systems regard any collision between two objects as completely inelastic. Therefore, in prior simulations of a plane landing on a carrier deck, as depicted in FIG. 1a, the plane would land as if it were a glob of clay, simply sticking to the carrier deck upon contact. The present invention simulates this event more realistically by depicting the landing as force-feedback contact, having the plane bounce slightly upon impact and pulled to a stop by the arresting gear.

FIG. 1b is a second illustration of a shortcoming of prior systems and the improvement achieved by the present invention. Prior systems could not exchange frictional forces between objects. If the tank moves out from under the person, there is no force-feedback on the shoes of the person to accelerate the person in the direction the tank is moving. Instead, the tank would appear to slide out from under the person. The present invention improves on this simulation by recognizing the sustained nature of the contact between the person and the tank, thereby recognizing that when the tank moves, it will exert an accelerating force on the person, who should move along with it.

While computer simulation of sustained contact as taught by the present invention has many civilian as well as defense applications, the preferred embodiment was developed as an improvement for previously existing military combat simulation systems.

Figure 2:
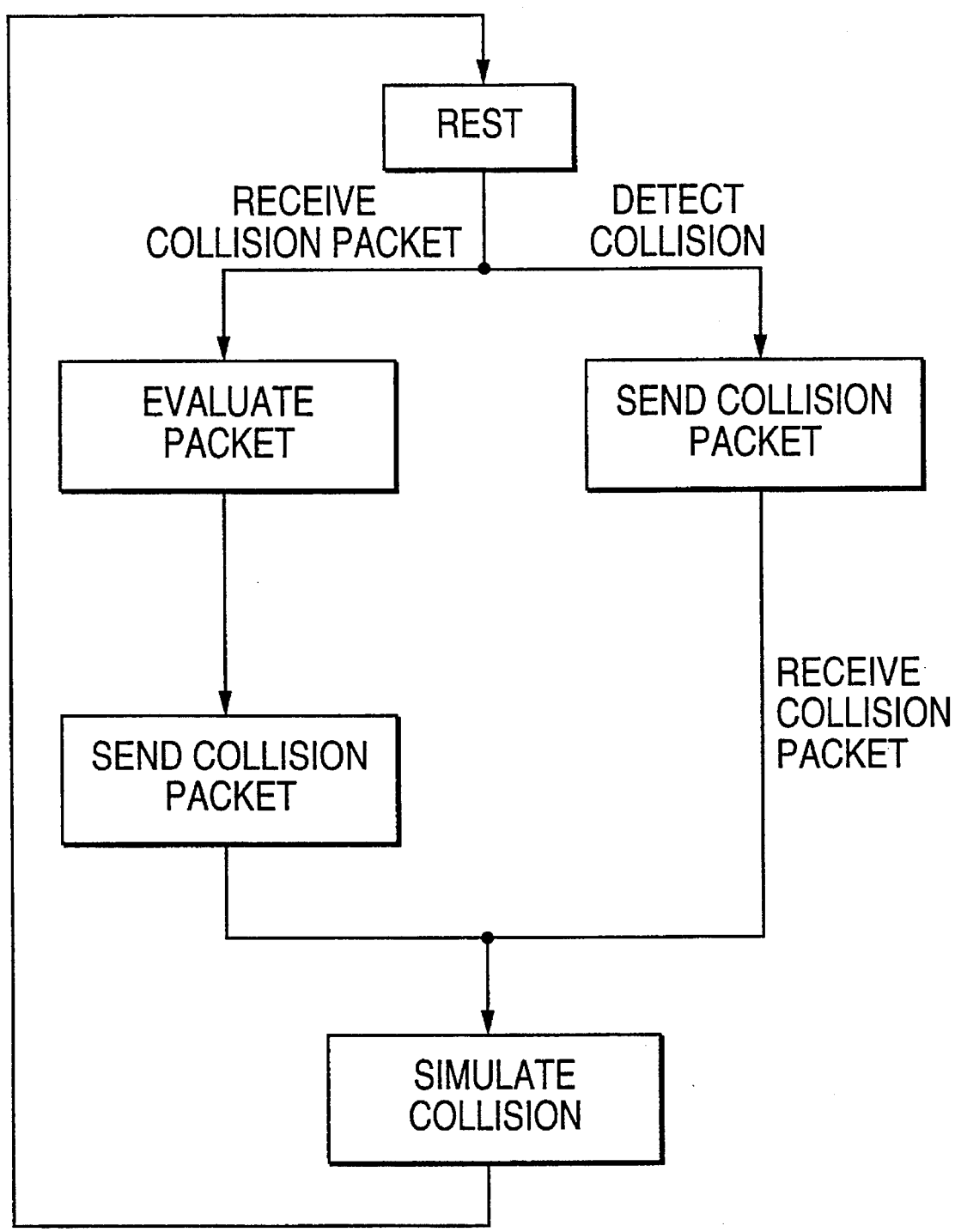
FIG. 2 illustrates a finite state machine for prior art collision interactions in DIS systems.

FIG. 2 is a collision finite state machine (FSM) illustrating how a DIS-like computer simulation system existing prior to the development of the present invention handles collisions. An object remains in the rest state until receiving a collision packet from another object or until it detects the collision itself. If it received a collision packet it sends a responding collision packet. If it sends a collision packet first, it then waits for the other object to send a responding collision packet. Each object then simulates the collision. Then, because prior systems handle collisions as a discrete one-time occurrence, the object immediately returns to the rest state. Even if the collision has resulted in the objects remaining in contact with each other, prior systems do not monitor or simulate the sustained contact.

There are two primary limitations in prior simulation systems which the present invention addresses. First, as explained with reference to FIG. 2, prior systems are unable to accurately and reliably simulate the effects of sustained contact. A second limitation of prior simulation systems concerns communication frequency, which will now be explained with reference to FIG. 3.

Figure 3:
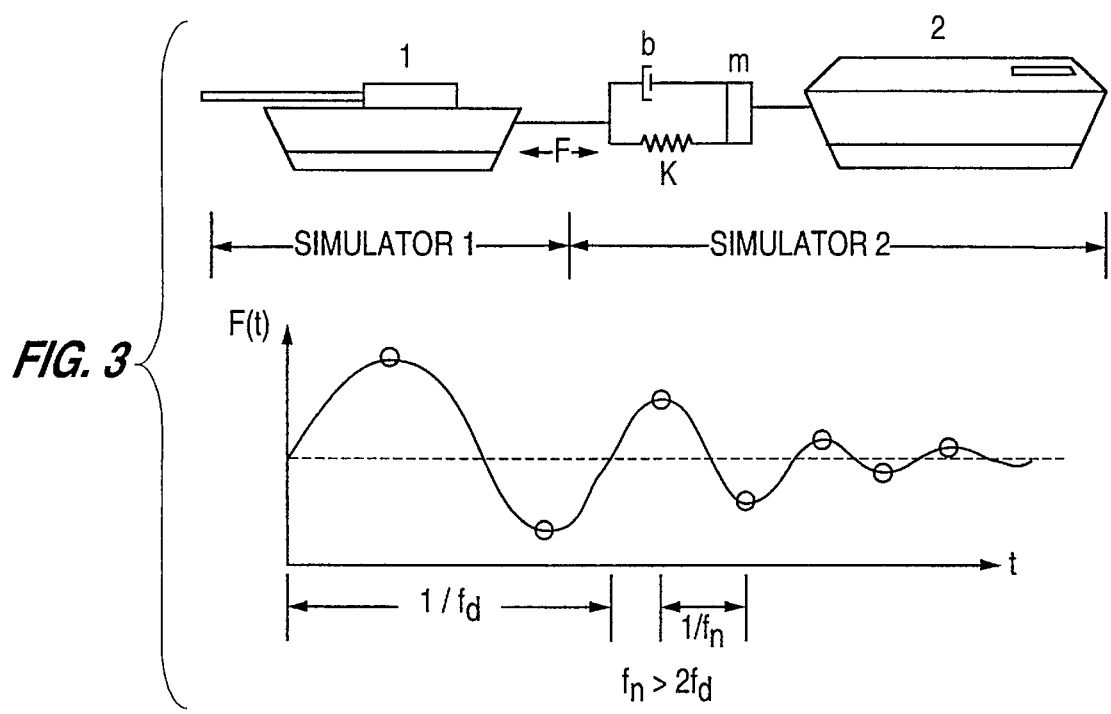
FIG. 3 illustrates the Nyquist frequency limitations on computer simulations of systems with natural frequencies.

Computer simulations typically run at discrete frame rates, quantizing time into discrete frames representing the state of the world at a particular time. To properly discern the waveform of systems with natural frequencies, the frame rate of the simulation must be at least the Nyquist Frequency, or twice the highest natural frequency of the system. FIG. 3 illustrates this theory.

If the highest natural frequency $f_d$ of a force resulting from an interaction between objects is 2 Hz, the frame rate (which must be at least equal to the Nyquist frequency $f_n$) must be at least 4 Hz, or 4 updates per second. If an object updates the other with 4 network packets per second, describing the force that one object is exerting on the other, the network would be severely loaded. Considering that prior DIS-like simulation systems require only 2–3 updates per second for basic state information (entity state packets), adding an extra 4 updates per second for a sustained contact would more than double the network load. These prior systems are unable to accommodate such a bandwidth-intensive function.

Figure 5:
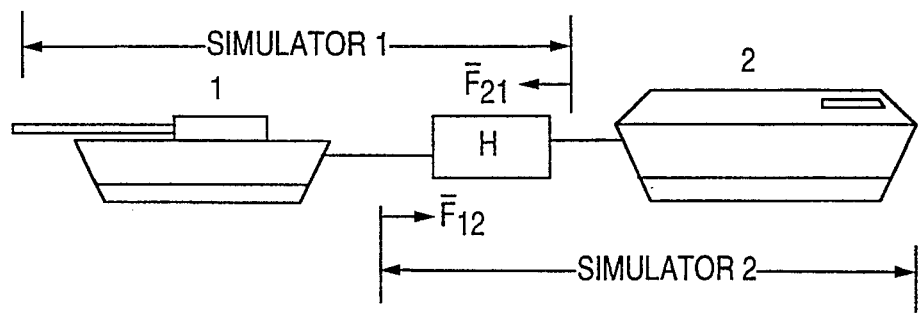
FIG. 5 illustrates the concept of the present invention, including sending the transfer function to two simulated entities.
Figure 4:
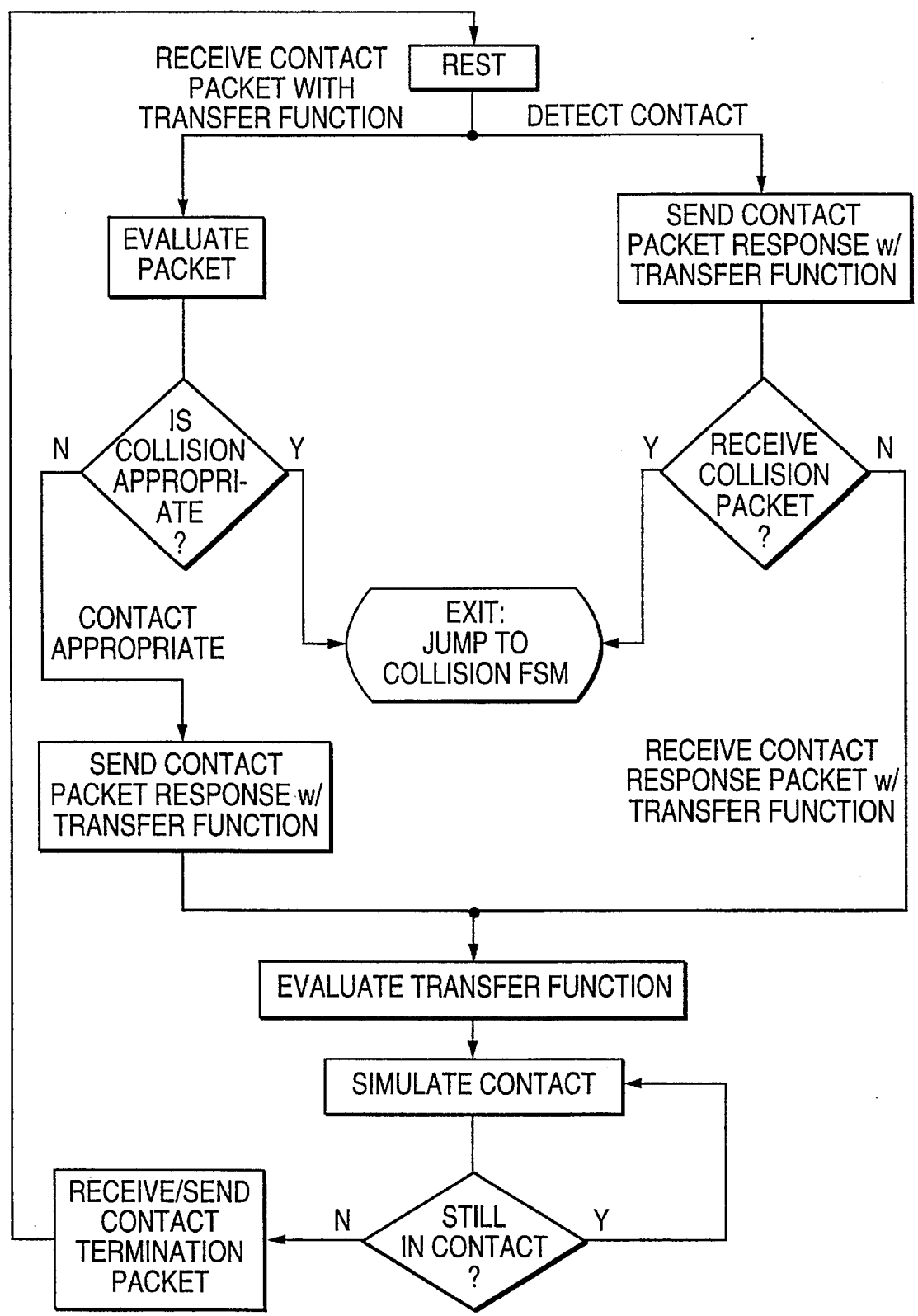
FIG. 4 illustrates a finite state machine for the present invention.

The present invention addresses both of the above-mentioned problems. FIG. 4 is a contact finite state machine that illustrates how the present invention provides a system capable of simulating sustained contact without unduly burdening the network bandwidth. FIG. 5 is a graphical depiction of the invention, showing the "transfer function" H, which will be described in greater detail, being simultaneously simulated by two objects.

As mentioned above, prior art simulations communicated collisions by collision packets which were sent between colliding objects over a network. Unlike the prior art, the present invention is able to differentiate between a momentary collision and a sustained contact, performing the appropriate simulation for either case. To accomplish this, the present invention uses a contact packet to establish a long-term relationship with another object in the case of a sustained contact. This contact packet contains the transfer function, which contains all the information needed for one object to compute the force exerted on it by the other object during the sustained contact. This enables simulation of the sustained contact without requiring the objects to increase network bandwidth by continually sending force information packets at the Nyquist Frequency rate, as explained above. When an object wants to discontinue the sustained contact, another packet is sent which dissolves the relationship.

As in prior systems, the initial state of a computer implemented object in the present invention is the rest state. The object remains in this state until receiving a contact packet from another object or until it detects contact with another object. At this point, unlike previous systems, the object determines whether the appropriate action is a collision or a contact: if collision is the proper response, the object jumps to the collision FSM, which could be one such as that illustrated in FIG. 2. If contact is the proper response, the object evaluates the transfer function sent in the contact packet from the other object, reconciles that transfer function with its own transfer function, sends its own transfer function to the first object, and simulates the contact. As noted above, an object in prior systems could only simulate a one-time collision, then return to the rest state, often resulting in an inaccurate simulation. Because the transfer function of the present invention enables simulation of sustained contact, the object remains in the connected state, continuing to simulate the sustained contact, until the contact terminates. Therefore, referring back to FIGS. 1a and 1b, the present invention enables the airplane to decelerate its forward movement on the carrier deck rather than simply sticking to it, and enables the person to move along with the moving tank, rather than falling off of it.

Thus, the present invention, as shown by FIGS. 4 and 5, improves upon prior systems by differentiating and handling both momentary collision contacts and sustained contacts. Moreover, these improvements are achieved in an efficient manner by a one-time communication of a transfer function between objects in sustained contact, following detection that such a contact has occurred. It should be noted, however, that the Nyquist Frequency restriction still limits the present invention to simulation of systems whose highest natural frequency is half the frame rate of the simulation frequency of the slower simulation.

As shown in FIGS. 4 and 5, the present invention requires evaluation of a transfer function, which contains information regarding the contact parameters of the force one object will exert on another. One skilled in the art will recognize that the transfer function can be implemented in numerous ways, the following embodiment being exemplary.

Sustained contact can be described by the forces exerted between the objects and can generally be analyzed by Newton's laws of motions:

1. F=0 implies v=constant, where F represents the force upon an object and v represents the velocity of the object. An object at rest tends to stay at rest, and an object in motion tends to stay in motion, unless acted upon by a force.

2. F=ma, where m is the mass of the object and a is its acceleration. The acceleration of an object is proportional to the force exerted upon it.

3. $F_{ab}=-F_{ba}$, where $F_{ab}$ represents the force exerted by object a on object b, and $F_{ba}$ represents the force exerted by object b on object a. In a two object interaction, the force exerted by the first object on the second is equal and opposite to the force exerted by the second on the first.

Contacts involving any of these relations will hereinafter be referred to as "Newtonian interactions." Examples of typical forces include:

1. Forces relating to the mass of the object:

$$F(t) = ma = m \frac{dV(t)}{dt} = m \frac{d^2P(t)}{dt^2}$$

where F(t)=force at time t

P(t)=position at time t

V(t)=velocity at time t m=mass a=acceleration

2. Forces relating to damper:

$$F(t) = bV(t) = b \frac{dP(t)}{dt}$$

where b=damping coefficient

3. Forces relating to springs:

$$F(t)=kP(t)$$

where k=spring constant

4. Forces relating to drag:

$$F(t) = \frac{1}{2} \rho V(t)^2 C_d A = \frac{1}{2} \rho \frac{dP(t)^2}{dt} C_d A$$

where ρ=density of the substance causing drag $C_d$=drag coefficient

A=surface area in contact with substance

These forces are representative of those occurring in physical systems. As shown, the force exerted by an object is generally a function of time, consisting of polynomial terms of time derivatives of the object's position. The force interaction between two objects is captured in the following highly parameterized general non-linear differential equation, whose parameters are sent over the network. Each simulated object, in advance, knows the general form of the equation. The parameters thus constitute a consistent language for communicating these force relationships. The equation is of the form:

$$\sum_{i_f=1}^{m_f} \prod_{j_f=1}^{n_f} f_{ij} \left[ \frac{d^{a_{ij}} F(t)}{dt^{a_{ij}}} \right] = \sum_{i_p=1}^{m_p} \prod_{j_p=1}^{n_p} p_{ij} \left[ \frac{d^{b_{ij}} P(t)}{dt^{b_{ij}}} \right]$$

where the left side of the equation is the force component, and the right side of the equation is the position component. The variables are as follows:

$m_f$: number of summation terms in force component $i_f$: summation index of force component, ranging from [1, $m_f$]

$n_f$: number of product terms in a summation term of force component $j_f$: product index in a summation term of force component, ranging from [1, $n_f$]

$f_{ij}$: numerical coefficient of the jth product term in the ith summation term in force component.

$a_{ij}$: order of the force derivative of the jth product term in the ith summation term in force component.

$m_p$: number of summation terms in position component $i_p$: summation index of position component, ranging from [1, $m_p$]

$n_p$: number of product terms in a summation term of position component $j_p$: product index in a summation term of position component, ranging from [1, $n_p$]

$p_{ij}$: numerical coefficient of the jth product term in the ith summation term in position component.

$b_{ij}$: order of the position derivative of the jth product term in the ith summation term in position component.

Figure 6:
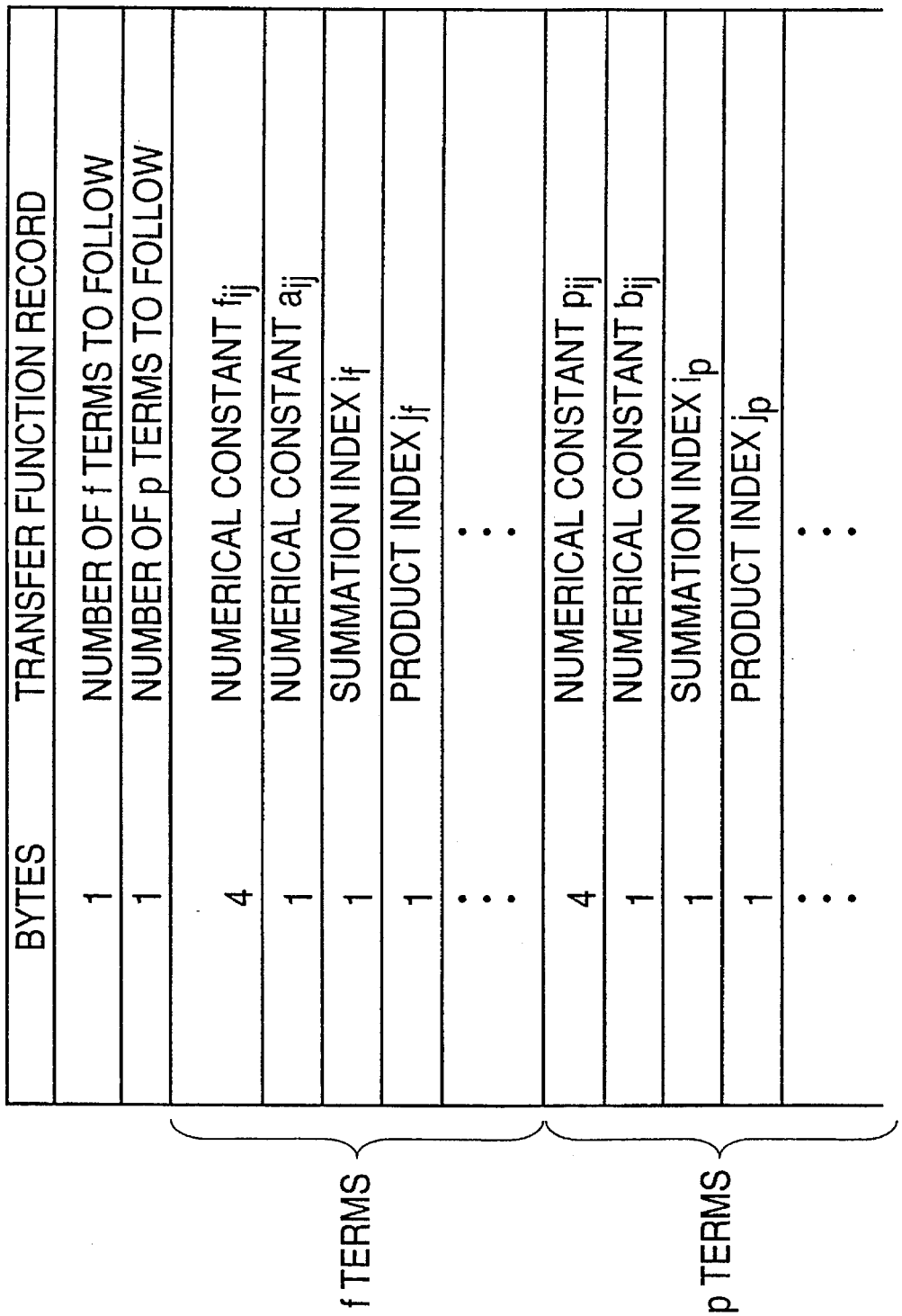
FIG. 6 illustrates a data structure for embodying the transfer function of the present invention.

There are many means and data structures that can be used to implement a transfer function for use in the present invention. The data structure represented in FIG. 6 illustrates one such possible solution. In addition, there are other parameterized differential equations which can be used to implement a transfer function. Application of this particular data structure for a transfer function record may be better understood through an example.

The present invention can be used to simulate an airplane's movement, which is affected by drag forces due to air resistance. The two objects in sustained contact in this example are the airplane and the air. After detecting the contact, the object representing air will create a transfer function record reflecting the drag force it will exert. Drag force is given by the equation:

$$F(t) = \frac{1}{2} \rho V(t)^2 C_d A = \frac{1}{2} \rho \frac{dP(t)^2}{dt} C_d A$$

The data structure variables as described above with reference to FIG. 6 are:

Number of f terms to follow: 1
Number of p terms to follow: 2

$f_{11} = 1$
$a_{11} = 0$
$i_f = 1$
$j_f = 1$ $p_{11} = \frac{1}{2} \rho C_d A \quad p_{12} = 1$
$b_{11} = 1 \quad b_{12} = 1$
$i_p = 1 \quad i_p = 1$
$j_p = 1 \quad j_p = 2$ Thus, the formula becomes:

$$F(t) = \frac{d^0 F(t)}{dt} = \frac{1}{2} \rho C_d A \left( \frac{dP(t)}{dt} \right) \left( \frac{dP(t)}{dt} \right)$$

FIG. 7 illustrates the representation of this formula using the data structure of FIG. 6.

There are numerous ways to create the transfer function record in such a way that it is accessible by the airplane object. One possibility is for the air object to include the transfer function record (or a pointer to it) as a parameter in its contact packet, which was described above with reference to FIG. 4, which it sends to the airplane object. By whatever means this is accomplished, once the airplane object has accessed the transfer function record, it has all the information it needs to simulate the effects of the drag force exerted on it by the air object until the contact between the air and the airplane terminates. This is a significant improvement over previous simulations, in which the airplane object would have to continually communicate with the air object in order to simulate the effects of the time- and space-dependent drag forces exerted by the air object on the airplane object, due to the sustained nature of the contact between the two objects.

Of course, it should be understood that a wide range of changes and modifications can be made to the preferred embodiment described above. As previously noted, the present invention is intended to have application in commercial as well as defense-related systems. It is therefore intended that the foregoing detailed description be illustrative instead of limiting, and that it is the following claims, including all equivalents, which are intended to define the scope of this invention.

What is claimed is:

1. A computer-implemented method for use in a distributed interactive simulation (DIS) type network protocol for simulating sustained contact of first and second computer implemented objects on each other in a virtual environment comprising the steps of:

providing a computer system comprising said first and second computer implemented objects;

storing in the computer system contact packets comprising data representative of the kinematic state of each of said first and second computer-implemented objects;

pre-programming said computer system to implement a transfer function describing said sustained contact of said first and second computer implemented objects on each other; and applying said transfer function to said first and second computer implemented objects based on the kinematic state data in said contact packets, thereby enabling said first and second computer implemented objects to simulate said sustained contract each will have on the other in the virtual environment of said DIS-type network protocol.

2. The computer-implemented method of claim 1, wherein said transfer function describing said sustained contact represents the relationship:

$$\sum_{i_f=1}^{m_f} \sum_{j_f=1}^{n_f} f_{ij} \left[ \frac{d^{a_{ij}} F(t)}{dt^{a_{ij}}} \right] = \sum_{i_p=1}^{m_p} \sum_{j_p=1}^{n_p} P_{ij} \left[ \frac{d^{b_{ij}} P(t)}{dt^{b_{ij}}} \right].$$

3. A computer system for use in a distributed interactive simulation (DIS) type network protocol for simulating sustained contact of a first computer implemented object on a second computer implemented object in a virtual environment wherein:

said computer system is programmed to implement a transfer function which describes said sustained contact of said first computer implemented object on said second computer implemented object, based on contact packets stored in said computer system which comprise data representative of the kinematic state of each of said first and second computer-implemented objects; and said transfer function enables said second computer implemented object to simulate said sustained contact on said first computer implemented object in the virtual environment of said DIS-type network protocol.

4. The computer system of claim 3, said computer system further comprising computer implemented transfer function records to store said transfer function describing said sustained contact.

5. The computer system of claim 3, said computer system further comprising computer implemented transfer function records for communicating said transfer function describing said sustained contact between said first and second computer implemented objects.

6. The computer system of claim 3, wherein said transfer function describing said sustained contact represents the relationship:

$$\sum_{i_f=1}^{m_f} \sum_{j_f=1}^{n_f} f_{ij} \left[ \frac{d^{aij} F(t)}{dt^{aij}} \right] = \sum_{i_p=1}^{m_p} \sum_{j_p=1}^{n_p} P_{ij} \left[ \frac{d^{bij} P(t)}{dt^{bij}} \right].$$

7. A computer program stored in and capable of being read by a computer system comprising a distributed interactive simulation (DIS) type network protocol for simulating sustained contact of first and second computer implemented objects in a virtual environment on each other, said computer program comprising:

instructions for implementing a transfer function to describe said sustained contact of said first and second computer implemented objects on each other based on contact packets stored in said computer system which comprise data representative of the kinematic state of each of said first and second computer-implemented objects; and instructions for applying said transfer function to said first and second computer implemented objects to simulate said sustained contact each will have on the other in the virtual environment of said DIS-type network protocol.

8. The computer program of claim 7, wherein said transfer function describing said sustained contact represents the relationship:

$$\sum_{i_f=1}^{m_f} \sum_{j_f=1}^{n_f} f_{ij} \left[ \frac{d^{aij} F(t)}{dt^{aij}} \right] = \sum_{i_p=1}^{m_p} \sum_{j_p=1}^{n_p} P_{ij} \left[ \frac{d^{bij} P(t)}{dt^{bij}} \right].$$

9. A computer program stored in and capable of being read by computer system comprising a distributed interactive simulation (DIS) type network protocol for simulating sustained contact of a first computer implemented object on a second computer implemented object in a virtual environment, said computer program comprising:

instructions for implementing a transfer function to describe said sustained contact of said first computer implemented object on said second computer implemented object based on contact packets in said computer system comprising data representative of the kinematic state of each of said first and second computer-implement objects; and instructions for applying said transfer function to said second computer implemented object, thereby enabling said second computer implemented object to simulate said sustained contact of said first computer implemented object in the virtual environment of said DIS-type network protocol.

10. The computer program of claim 9, wherein said transfer function describing said sustained contact represents the relationship:

$$\sum_{i_f=1}^{m_f} \sum_{j_f=1}^{n_f} f_{ij} \left[ \frac{d^{aij} F(t)}{dt^{aij}} \right] = \sum_{i_p=1}^{m_p} \sum_{j_p=1}^{n_p} P_{ij} \left[ \frac{d^{bij} P(t)}{dt^{bij}} \right].$$

11. The computer program of claims 7 or 9, said computer program further comprising instructions for establishing computer implemented transfer function records to store said transfer function describing said sustained contact.

12. The computer program of claims 7 or 9, said computer program further comprising instructions for establishing computer implemented transfer function records for communicating said transfer function describing said sustained contact between said first and second computer implemented objects.

13. A computer-implemented method for use in a distributed interactive simulation (DIS) type network protocol for first and second computer implemented objects to simulate sustained contact with each other in a virtual environment comprising the steps of:

providing a computer system comprising at least one computer and at least one computer model, said first and said second computer implemented objects stored in said computer system;

detecting contact between said first and said second computer implemented objects;

determining whether said contact is a sustained contact;

preprogramming said computer to implement a transfer function between said first and second computer implemented objects;

evaluating said transfer function so as to describe said sustained contact of said first and second computer implemented objects on each other based on contact packets stored in said computer system comprising data representative of the kinematic state of each of said first and second computer-implemented, objects; and applying said transfer function to said first and second computer implemented objects in said virtual environment of said DIS-type, network protocol, thereby enabling said first and second computer implemented objects to simulate said sustained contact with each other based on the kinematic state data in said contact packets, until said first and second computer implemented objects detect termination of said contact.

14. The computer-implemented method of claim 13, wherein said transfer function describing said sustained contact represents the relationship:

$$\sum_{i_f=1}^{m_f} \sum_{j_f=1}^{n_f} f_{ij} \left[ \frac{d^{aij} F(t)}{dt^{aij}} \right] = \sum_{i_p=1}^{m_p} \sum_{j_p=1}^{n_p} P_{ij} \left[ \frac{d^{bij} P(t)}{dt^{bij}} \right].$$

15. A computer-implemented method for using distributed interactive simulation (DIS) type network protocol for a first computer implemented object to simulate sustained contact with a second computer implemented object in a virtual environment comprising the steps of:

providing a computer system comprising at least one computer and at least one computer model, said first and said second computer implemented objects stored in said computer system;

detecting contact between said first and said second computer implemented objects;

determining whether said contact is a sustained contact;

pre-programming said computer to implement a transfer function between said first and second computer implemented objects;

evaluating said transfer function so as to describe said sustained contact of said second computer implemented object on said first computer implemented object based on contact packets stored in said computer system comprising data representative of the kinematic state of each of said first and second computer-implemented object; and applying said transfer function to said first computer implemented object, thereby enabling said first computer implemented object to simulate said sustained contact of said second computer implemented object based on the kinematic state data in said contact packets, until detecting termination of said contact with said second computer implemented object.

16. The computer-implemented method of claim 15, wherein said transfer function describing said sustained contact represents the relationship:

$$\sum_{i_f=1}^{m_f} \sum_{j_f=1}^{n_f} f_{ij} \left[ \frac{d^{aij} F(t)}{dt^{aij}} \right] = \sum_{i_p=1}^{m_p} \sum_{j_p=1}^{n_p} P_{ij} \left[ \frac{d^{bij} P(t)}{dt^{bij}} \right].$$

* * * * *